United States Patent [19]
Komatsu et al.

[11] Patent Number: 5,170,079
[45] Date of Patent: Dec. 8, 1992

[54] COLLECTOR DOT AND CIRCUIT WITH LATCHED COMPARATOR

[75] Inventors: Yoshihiro Komatsu; Yuji Gendai, both of Kanagawa, Japan

[73] Assignee: Sony Corporation, Tokyo, Japan

[21] Appl. No.: 781,593

[22] Filed: Oct. 23, 1991

[30] Foreign Application Priority Data

Oct. 25, 1990 [JP] Japan ................. 2-288162

[51] Int. Cl.$^5$ ............... H03K 19/086; G06G 7/12
[52] U.S. Cl. ................... 307/455; 307/494; 307/272.1; 307/355
[58] Field of Search ............ 307/455, 445, 355, 364, 307/494, 496, 272.1–272.3, 475

[56] References Cited

U.S. PATENT DOCUMENTS

| | | |
|---|---|---|
| 4,560,888 | 12/1985 | Oida .................... 307/272.2 |
| 4,755,693 | 7/1988 | Suzuki et al. ........... 307/455 |
| 5,001,361 | 3/1991 | Tamamura et al. ......... 307/272.2 |

*Primary Examiner*—Edward P. Westin
*Assistant Examiner*—Andrew Sanders
*Attorney, Agent, or Firm*—Hill, Van Santen, Steadman & Simpson

[57] ABSTRACT

A logic circuit which can operate to form a logic AND signal of a predetermined voltage level in accordance with a potential difference between a plurality of input signals using a collector dot AND circuit and a latched comparator circuit without the necessity of provision of a NOT circuit or a level shifting circuit at a preceding stage to the logic circuit. The logic circuit comprises a collector dot AND circuit, a logic level outputting circuit and a plurality of emitter follower circuits. Output electrodes of those of the emitter followers which are connected to receive NOT signals of input signals developed from the collector dot AND circuit are coupled commonly to form a wired OR circuit, and an output of the wired OR circuit is supplied to a transistor of the logic level outputting circuit connected to receive a logic AND signal of the input signals developed from the collector dot AND circuit so as to form a NOT signal of the logic AND signal.

6 Claims, 3 Drawing Sheets

COLLECTOR DOT AND CIRCUIT WITH LATCHED COMPARATOR

BACKGROUND OF THE INVENTION

1. Field of the Invention

This invention relates to a logic circuit, and more particularly to a logic circuit which is constituted from a collector dot AND circuit and a latched comparator circuit.

2. Description of the Prior Art

Various logic circuits have conventionally been put into practical use which is constituted from a combination of an AND circuit which receives a plurality of input signals such as a first input signal A and a second input signal B and outputs a logic AND of such input signals with a latched comparator circuit.

An exemplary one of such conventional logic circuits is shown in FIG. 2. The logic circuit shown is constituted from a modified AND circuit of OR and a latched comparator circuit in combination and has a first input terminal 1 and a second input terminal 2. The logic circuit receives, at the first and second input terminals 1 and 2 thereof, input NOT signals AN and BN of first and second input signals A and B. respectively.

An input NOT signal AN of a first input signal A received at the first input terminal 1 of the logic circuit is provided to the base of a transistor Q1. Meanwhile, another input NOT signal BN of a second input signal B received at the second input terminal 2 is provided to the base of another transistor Q3. The emitters of the transistors Q1 and Q3 and a further transistor Q4, to which a reference signal VREF1 is provided, are connected commonly such that a first differential circuit may be constituted from the transistors Q1, Q3 and Q4. A second differential circuit is constituted from transistors Q5 and Q7 and provided at a next stage to the first differential circuit. A third differential circuit is provided in order to selectively operate the first and second differential circuits. The third differential circuit includes a transistor Q2 to the collector of which the commonly connected emitters of the first differential circuit are connected. The third differential circuit further includes another transistor Q6 to the collector of which the commonly connected emitters of the second differential circuit are connected.

A clock signal CLK is provided to the base of the transistor Q6 while a NOT signal CLKN of the clock signal CLK is provided to the base of the transistor Q2, and the emitters of the transistors Q2 and Q6 are connected commonly and grounded by way of a constant-current source 20. A series circuit of a transistor Q8 and a constant-current source 21 and another series circuit of another transistor Q9 and another constant-current source 22 are connected in parallel to the first to third differential circuits, that is, between a power source Vcc and the ground GND. Each of the two series circuits constitutes an emitter follower for developing a logic level signal, and the collectors of the transistors Q1, Q3 and Q5 are connected to the base of the transistor Q8 while the base of the transistor Q7 is connected to the emitter of the transistor Q8.

Meanwhile, the collectors of the transistors Q4 and Q7 are connected to the base of the transistor Q9 while the base of the transistor Q5 is connected to the emitter of the transistor Q9. Thus, a signal outputted from the emitter of the transistor Q8 is led out to a first output terminal 11 of the logic circuit as an AND output signal A·B of a first input signal A and a second input signal B while a signal outputted from the emitter of the transistor Q9 is led out to a second output terminal 12 as an inverted AND output signal A·B of the first input signal A and the second input signal B.

A resistor R1 is connected between the collector of the transistor Q1 and the power source Vcc while another resistor R2 is connected between the collector of the transistor Q4 and the power source Vcc.

Subsequently, operation of the logic circuit of FIG. 2 having such construction as described above will be described. It is to be noted that the following description proceeds on the assumption that the logic circuit does not include the transistor Q1 and does not receive a first input signal A in order to facilitate the description. Where the transistor Q1 is omitted in this manner, the logic circuit of FIG. 2 operates in a quite similar manner as an ordinary latched comparator circuit.

In the logic circuit of FIG. 2, when the NOT signal CLKN of a clock signal CLK is "H" (high), an electric current I1 flowing through the constant-current source 20 flows only through the transistor Q2 but does not flow through the transistor Q6. Accordingly, no electric current flows through either of the transistors Q5 and Q7 which constitute the second differential circuit, and the electric current I1 flows only either one of the transistors Q3 and Q4. In this instance, the electric current I1 flows in response to magnitudes of an input NOT signal BN and a reference signal VREF1, and when the difference in voltage between the two signals BN and VREF1 is great, the electric current I1 flows only through the transistor Q3 or Q4. However, when the difference in voltage is small, electric currents flow through the transistors Q3 and Q4 in accordance with magnitudes of the voltages of the signals BN and VREF1.

In this instance, since the resistance of the collector of the transistor Q3 is provided by the resistor R1 and the resistance of the collector of the transistor Q4 is provided by the resistor R2, voltage drops take place across the resistors R1 and R2 in accordance with magnitudes of the electric currents from the collectors of the transistors Q3 and Q4, respectively. Accordingly, if the input NOT signal BN is a little higher than the reference signal VREF1, a higher electric current will flow through the transistor Q3, and accordingly, a voltage value at the collector of the transistor Q3 will be a little lower than a voltage value at the collector of the transistor Q4. It is assumed here that, in such condition, the NOT signal CLKN of the clock signal CLKN is changed into "L" (low). Consequently, an electric current begins to flow through the transistor Q6 while the electric current which has flowed through the transistor Q2 till then is stopped, and also the electric currents which have flowed through the transistors Q3 and Q4 are stopped.

When an electric current begins to flow through the transistor Q6, also electric currents begin to flow through the transistors Q5 and Q7. In this instance, since the collector of the transistor Q4 is "H", the base of the transistor Q9 and the collector of the transistor Q7 are "H". On the other hand, since the collector of the transistor Q3 is "L", the base of the transistor Q8 and the collector of the transistor Q5 are "L". Accordingly, the base of the transistor Q7 presents "L" while the base of the transistor Q5 presents "H". Consequently, at an instant when the clock signal CLK is changed into "H", a little higher electric current will flow through the transistor Q5 while an electric current flowing through the resistor R1 tends to increase a little. Consequently, the electric current of the collector of the transistor Q7 will be decreased reversely, and the voltage at the resistor R2, which has formerly been "H", varies so as to become further higher. In other words, the potential at the resistor R2 which has been "H" tends to further become higher while the potential at the resistor R1 which has been "L" tends to further become lower. Since such voltages are provided to the bases of the transistors Q8 and Q9, positive feedback is repeated among the transistors described above. Consequently, a difference in voltage which has been a little between the input NOT signal BN and the reference signal VREF1 is amplified by a comparator mode and a positive feedback mode is entered at an instant when the clock signal CLK is reversed to "H", and an "H" level and an "L" level are distinguished clearly. In particular, the logic circuit effects an analog operation in a comparator mode but effects a digital operation in a positive feedback mode. As the logic circuit operates in this manner, an AND output signal A·B is led out to the first output terminal 11 of the logic circuit while an inverted AND output signal A·B is led out to the second output terminal 12.

Since the logic circuit shown in FIG. 2 operates in such a manner as described above, signals to be supplied to the first and second input terminals 1 and 2 of the logic circuit must necessarily be input NOT signals, and accordingly, a NOT circuit must be provided at a preceding stage to each of the input terminals 1 and 2. Accordingly, there are drawbacks that some delay takes place with such input signal and circuit construction of the logic circuit is complicated as much.

Also logic circuits are conventionally known which do not require provision of such NOT circuits at a preceding stage as different from the logic circuit shown in FIG. 2. An exemplary one of such conventional logic circuits is shown in FIG. 3. Referring now to FIG. 3, the logic circuit shown is constituted from a combination of an AND circuit called cascade AND circuit and a latched comparator circuit and includes an AND circuit at a first stage including a first differential pair composed of transistors Q1 and Q4 and a second differential pair composed of transistors Q2 and Q5. In the case of the logic circuit of FIG. 3, a first input signal A supplied to a first input terminal 1 of the logic circuit is supplied to the base of the transistor Q1 constituting the first differential pair while a first reference signal VREF1 is supplied to the base of the transistor Q4. Meanwhile, a second input signal B supplied to a second input terminal 2 of the logic circuit is supplied to the base of the transistor Q2 while a second reference signal VREF2 is supplied to the base of the transistor Q5. And, a voltage at the collectors of the transistors Q4 and Q5 is supplied to the base of a transistor Q10 while another voltage at the collector of the transistor Q1 is supplied to another transistor Q9. Consequently, an AND output signal A·B is obtained from the emitter of the transistor Q10 while an inverted AND output signal A·B signal is obtained from the emitter of the transistor Q9. It is to be noted that construction and operation of the other portion part of the logic circuit of FIG. 3 are similar to those of the logic circuit of FIG. 2, and accordingly, overlapping description thereof is omitted herein to avoid redundancy.

The logic circuit of FIG. 3 is advantageous in that, since first and second input signals A and B can be inputted directly to the logic circuit as described hereinabove, NOT circuits need not be provided at a preceding stage. However, the logic circuit of FIG. 3 has a drawback that, since the level of the second input signal B must be lower by a predetermined level than that of the first input signal A, a level shifting circuit must be provided at a preceding stage.

SUMMARY OF THE INVENTION

It is an object of the present invention to provide a logic circuit which can operate without the necessity of provision of a NOT circuit or a level shifting circuit at a preceding stage to the same.

In order to attain the object, according to the present invention, there is provided a logic circuit having a plurality of input terminals, which comprises a collector dot AND circuit connected to the input terminals and capable of developing a logic AND signal and NOT signals of input signals received by way of the input terminals, a logic level outputting circuit composed of a plurality of transistors with the emitters coupled commonly, the transistors being connected to individually receive, at the collectors thereof, signal voltages developed from the collector dot AND circuit, and a plurality of emitter follower circuits each including a transistor connected to receive, at the base thereof, a corresponding one of the signal voltages developed from the collector dot AND circuit, output electrodes of those of the emitter followers which are connected to receive, at the bases thereof, the NOT signals of the input signals developed from the collector dot AND circuit being coupled commonly to form a wired OR circuit which is connected to supply an output thereof to the base of one of the transistors of the logic level outputting circuit which is connected to receive, at the collector thereof, the logic AND signal of the input signals developed from the collector dot AND circuit, an output voltage of one of the emitter followers which is connected to receive, at the base thereof, the logic AND signal of the input signals developed from the collector dot AND circuit being provided to an output terminal of the logic circuit and also to the bases of those of the transistors of the logic level outputting circuit which are connected to receive, at the collectors thereof, the NOT signals of the input signals developed from the collector dot AND circuit.

In the logic circuit, the output electrodes of those of the emitter followers at an output stage which are connected to receive, at the bases thereof, the NOT signals of the input signals developed from the collector dot AND circuit are coupled commonly to form a wired OR circuit so that a NOT signal of a logic AND signal which cannot be developed from the collector dot AND circuit may be developed from the wired OR circuit. Accordingly, a logic circuit for forming a logic AND signal of a predetermined voltage level in accordance with a difference or differences in potential between or among a plurality of input signals can be constructed from a latched comparator circuit in which a collector dot AND circuit which can operate without provision of a NOT circuit or a level shifting circuit at a preceding stage is incorporated. Accordingly, the logic circuit thus obtained operates at a high speed without a signal delay which may otherwise be caused by such NOT circuit or level shifting circuit at a preceding stage.

BRIEF DESCRIPTION OF THE DRAWINGS

FIG. 2 is a circuit diagram showing a conventional logic circuit which employs a modified AND circuit of.

DETAILED DESCRIPTION OF THE PREFERRED EMBODIMENT

Figure 1:
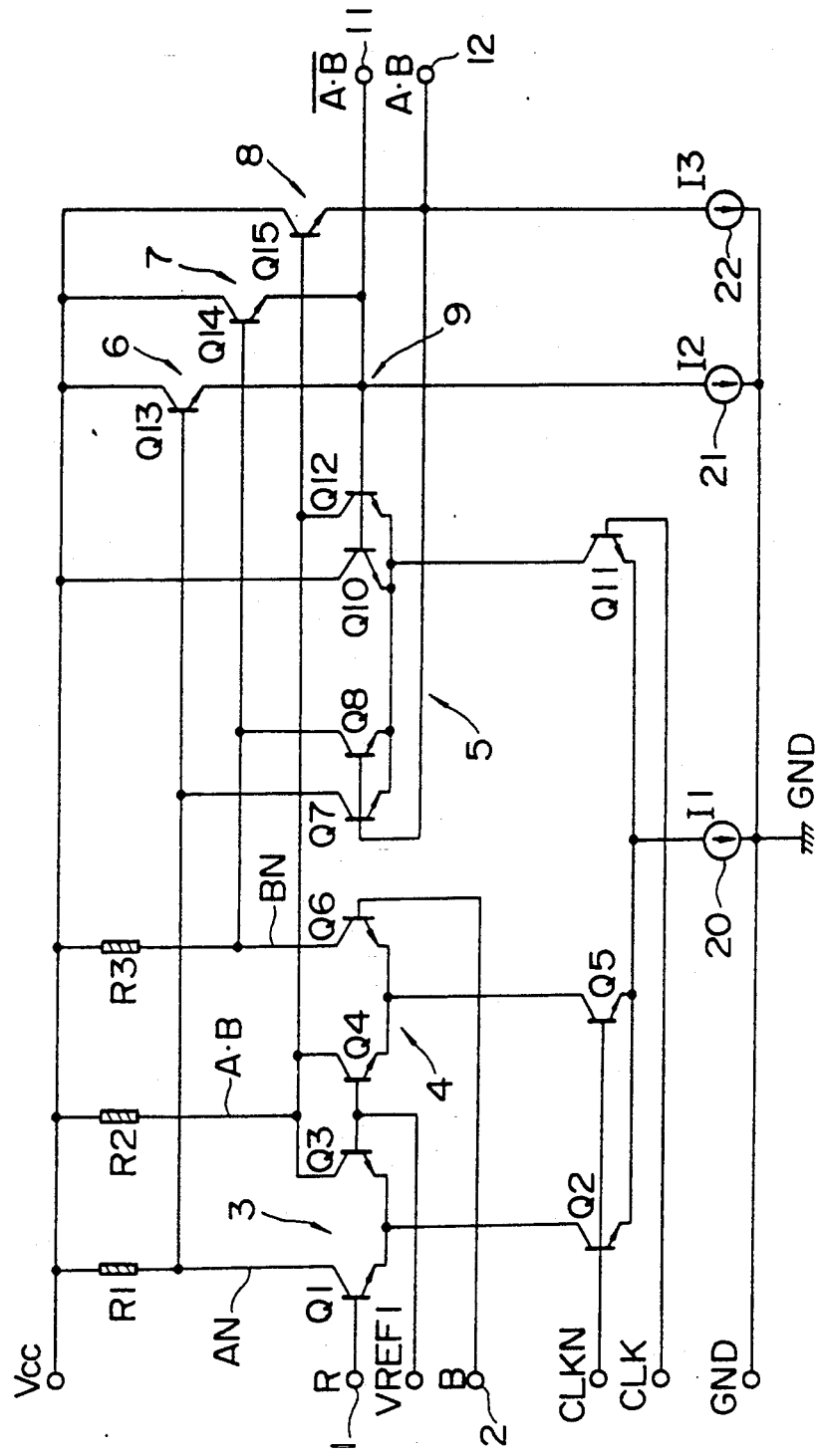
FIG. 1 is a circuit diagram of a logic circuit showing a preferred embodiment of the present invention.

Referring to FIG. 1, there is shown a logic circuit to which the present invention is applied. The logic circuit shown is constructed from a latched comparator incorporated in a collector dot AND circuit and includes a first differential circuit 3 composed of a pair of transistors Q1 and Q3 and a second differential circuit 4 composed of another pair of transistors Q4 and Q6. Part of an electric current I1 which flows through a constant-current source 20 is supplied to each of the first and second differential circuits 3 and 4 by way of a transistor Q2 or Q5 which is provided as a constant-current source.

The base of the transistor Q1 constituting the first differential circuit 3 is connected to a first input terminal 1 of the logic circuit so that a first input signal A is provided to the base of the transistor Q1. Meanwhile, the base of the transistor Q6 constituting the second differential circuit 4 is connected to a second input terminal 2 of the logic circuit so that a second input signal B is provided to the base of the transistor Q6. The bases of the transistors Q3 and Q4 are connected commonly, and a reference signal VREF1 is provided to the thus commonly connected bases. The collectors of the transistors Q3 and Q4 are also connected commonly but to a power source Vcc by way of a resistor R2. On the other hand, the collector of the transistor Q1 is connected to the power source Vcc by way of another resistor R1 while the collector of the transistor Q6 is connected to the power source Vcc by way of a further resistor R3.

At a next stage to the first and second differential circuits constructed in this manner, a third differential circuit 5 for effecting such a latching operation as described hereinabove is provided and also three emitter follower circuits 6, 7 and 8 are provided. The third differential circuit 5 is constructed such that the emitters of transistors Q7, Q8, Q10 and Q12 are connected commonly while the bases of the transistors Q7 and Q8 and the bases of the transistors Q10 and Q12 are connected commonly.

Figure 2:
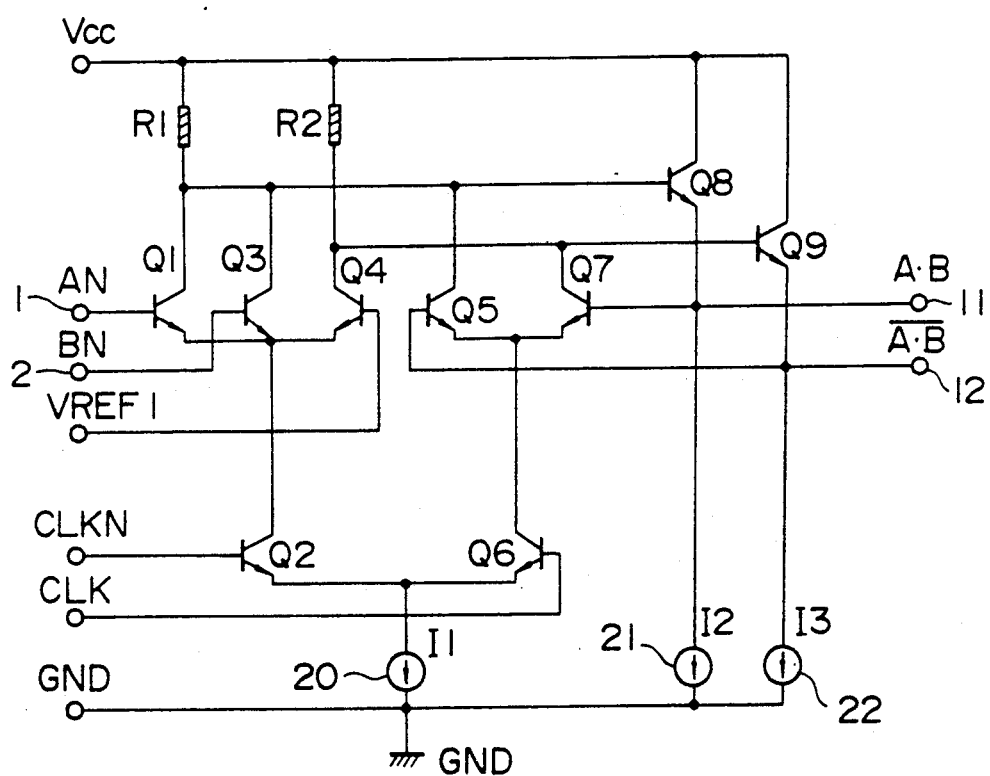
Figure 3:
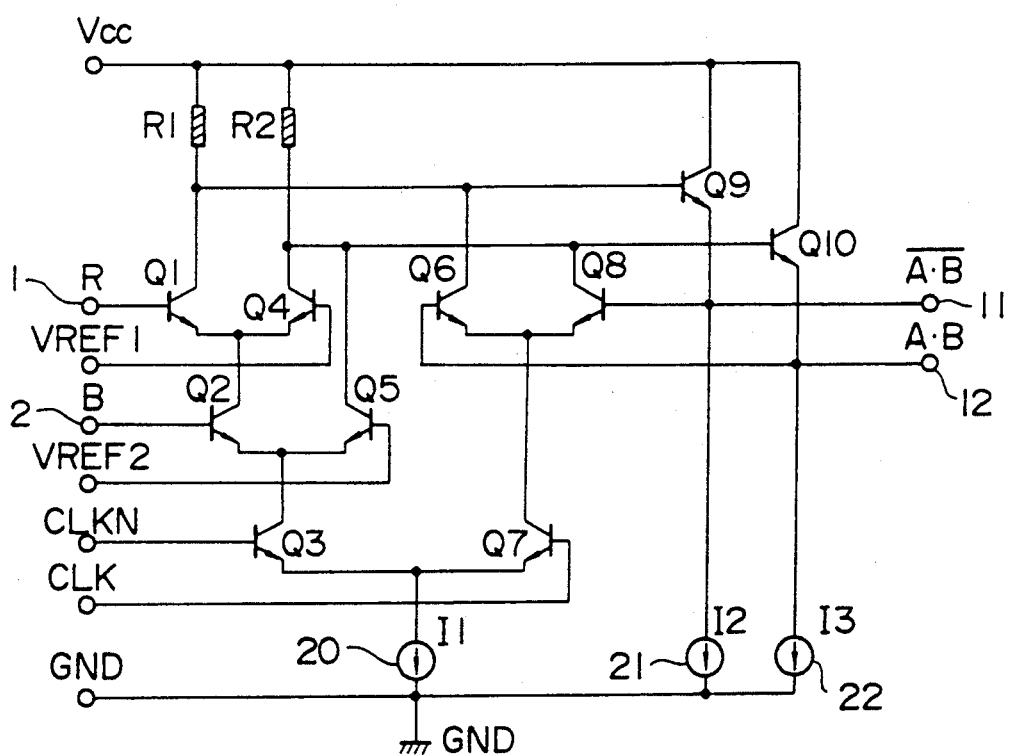
FIG. 3 is a similar view but showing another conventional logic circuit which employs a cascade AND circuit.

As an operating electric current of the third differential circuit 5, an electric current of the constant-current source 20 is provided to the third differential circuit 5 by way of a transistor Q11 provided as a constant-current source. A clock signal CLK is provided to the base of the transistor Q11. Meanwhile, a NOT signal CLKN of the clock signal CLK is provided to the commonly connected bases of the transistors Q2 and Q5. Accordingly, in the logic circuit of FIG. 2, when the NOT signal CLKN of the clock signal CLK is "H", an operating electric current is supplied to the transistors Q2 and Q5 so that the logic circuit effects an operation as a comparator, but when the clock signal CLK is "H", an operating electric current is supplied to the transistor Q11 so that the logic circuit effects a latching operation.

When the NOT signal CLKN of the clock signal CLK is "H" and accordingly a comparator operation is being effected, the potential at the collector of the transistor Q1 makes an input NOT signal AN of the first input signal A while the potential at the collector of the transistor Q6 makes an input NOT signal BN of the second input signal B. Meanwhile, the potential at the collectors of the transistors Q3 and Q4 presents A·B as a result of ANDing of the input signals A and B.

The potential at the collector of the transistor Q1 is provided to the base of a transistor Q13 constituting the first emitter follower circuit 6 and also to the collector of the transistor Q7 constituting the third differential circuit. Meanwhile, the potential at the collector of the transistor Q6 is provided to the base of a transistor Q14 constituting the second emitter follower circuit 7 and also to the collector of the transistor Q8. In the meantime, the potential at the collectors of the transistors Q3 and Q4 is provided to the base of a transistor Q15 constituting the third emitter follower circuit 8 and also to the collector of the transistor Q12. It is to be noted that the collector of the transistor Q10 which is the remaining one of the transistors constituting the third differential circuit 5 is connected to the power source Vcc. This is because it is intended, upon latching operation of the logic circuit, to make the magnitudes of an electric current flowing through the resistor R2 and electric currents flowing through the resistors R1 and R3 uniform to make the logic magnitude constant.

On the other hand, the emitters of the transistors Q13 and Q14 are connected commonly, and a constant-current source 21 is connected to the commonly connected emitters. The emitters of the transistors Q13 and Q14 are connected commonly in this manner to constitute a wired OR circuit so that an inverted AND output signal A·B, which cannot be developed from a collector dot circuit, may be obtained from a junction 9 between the emitters of the transistors Q13 and Q14.

The potential at the junction 9 is provided to a first output terminal 11 of the logic curcuit and also to the bases of the transistors Q10 and Q12. Meanwhile, the emitter of the transistor Q15 is connected to a constant-current source 22 so that a potential at the emitter of the transistor Q15 may be provided to a second output terminal 12 of the logic circuit and the bases of the transistors Q7 and Q8.

In the logic circuit of the embodiment constructed in such a manner as described above, when it effects a comparator operation, the potential at the collector of the transistor Q1 makes a NOT signal AN of the first input signal A while the potential at the collector of the transistor Q6 makes a NOT signal BN of the second input signal B. Meanwhile, the potential at the collectors of the transistors Q3 and Q4 makes an AND signal A·B of the first and second input signals A and B. The potentials at those collectors are provided to the latched comparator circuit at the next stage as described hereinabove.

When the voltage levels of the clock signal CLK and the NOT signal CLKN of such clock signal CLK are reversed in such an operating condition as described just above, an electric current, which has flowed through the transistors Q2 and Q5, now flows through the transistor Q11, and consequently, the logic circuit of the embodiment of FIG. 1 now effects a latching operation. In this instance, since the transistor Q11 is rendered conductive, when the potential at the second output terminal 12 of the logic circuit is "L" upon latching operation, since the transistor Q11 is rendered conductive, electric currents flow through the transistors Q7 and Q8 so that the potentials at the collectors of the transistors Q7 and Q8 are changed to "L". In the meantime, since no electric current flows through the transistor Q12, the potential at the collector of the transistor Q12 is "H", and accordingly, the "H" state of the AND output signal A·B led out to the second output terminal 12 is maintained.

Further, when the potential at the second output terminal 12 of the logic circuit is "L" upon latching operation, no electric current flows through either of the transistors Q7 and Q8, and consequently, the potentials at the collectors of the transistors Q7 and Q8 present "H". In this instance, electric currents flow through the transistors Q12 and Q10, and as a result, the potential at the collector of the transistor Q12 presents "L", and consequently, the "L" level at the second output terminal 12 is maintained.

Since the logic circuit of the embodiment operates in such a manner as described above, it can be applied not only to an AND circuit designed to receive two input signals but also to any AND circuit designed to receive three or more input signals. On the other hand, if the logic circuit shown in FIG. 1 is modified such that a second input signal B is inputted to the base of the transistor Q4 while a reference signal VREF1 is inputted to the base of the transistor Q6, then a signal of A·B can be obtained from the output terminal 11.

Having now fully described the invention, it will be apparent to one of ordinary skill in the art that many changes and modifications can be made thereto without departing from the spirit and scope of the invention as set forth herein.

What is claimed is:

1. A logic circuit having a plurality of input terminals, comprising:
   a collector dot AND circuit connected to said input terminals and capable of developing a logic AND signal and NOT signals of input signals received by way of said input terminals;
   a logic level outputting circuit composed of a plurality of transistors with the emitters coupled commonly, said transistors being connected to individually receive, at the collectors thereof, signal voltages developed from said collector dot AND circuit; and
   a plurality of emitter follower circuits each including a transistor connected to receive, at the base thereof, a corresponding one of the signal voltages developed from said collector dot AND circuit;
   output electrodes of those of said emitter followers which are connected to receive, at the bases thereof, the NOT signals of the input signals developed from said collector dot AND circuit being coupled commonly to form a wired OR circuit which is connected to supply an output thereof to the base of one of said transistors of said logic level outputting circuit which is connected to receive, at the collector thereof, the logic AND signal of the input signals developed from said collector dot AND circuit;
   an output voltage of one of said emitter followers which is connected to receive, at the base thereof, the logic AND signal of the input signals developed from said collector dot AND circuit being provided to an output terminal of said logic circuit and also to the bases of those of said transistors of said logic level outputting circuit which are connected to receive, at the collectors thereof, the NOT signals of the input signals developed from said collector dot AND circuit.

2. A logic circuit according to claim 1, wherein said logic level outputting circuit includes an additional transistor connected such that the base is connected to receive the output of said wired OR circuit; the emitter is connected to the emitters of the other transistors of said logic level outputting circuit; and the collector is connected to a power source.

3. A logic circuit according to claim 1, wherein said logic circuit further has a reference signal input terminal, and said collector dot AND circuit includes a first set of transistors connected to individually receive the input signals at the bases thereof and output NOT signals of the input signals from the collectors thereof, and a second set of transistors individually connected at the emitters thereof to the emitters of corresponding ones of said transistors of said first set and connected to receive, at the bases thereof, a reference signal by way of said reference signal input terminal and output a logic AND signal of the input signals from the collectors thereof.

4. A logic circuit according to claim 3, wherein said collector dot AND circuit further includes a resistor connected between the collector of each of said transistors of said first set and a power source, and another resistor connected between the collectors of said transistors of said second set and said power source.

5. A logic circuit according to claim 3, wherein said logic circuit further has a clock signal input terminal, and said collector dot AND circuit further includes a third set of transistors connected such that the bases are connected to said clock signal input terminal to receive a clock signal; the emitters are connected commonly to be supplied with an electric current; and the collectors are individually connected to the emitters of corresponding ones of said transistors of said first and second sets.

6. A logic circuit according to claim 3, wherein said logic circuit further has a clock signal input terminal, and said collector dot AND circuit further includes a third set of transistors connected such that the bases are connected to said clock signal input terminal to receive a NOT signal of a clock signal; the emitters are connected commonly to be supplied with an electric current; and the collectors are individually connected to the emitters of corresponding ones of said transistors of said first and second sets.

* * * * *